United States Patent
Kondou (10) Patent No.: US 7,911,252 B2
(45) Date of Patent: Mar. 22, 2011

(54) CLOCK SIGNAL GENERATION CIRCUIT

(75) Inventor: Masafumi Kondou, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/606,666

(22) Filed: Oct. 27, 2009

(65) Prior Publication Data

US 2010/0134162 A1 Jun. 3, 2010

(30) Foreign Application Priority Data

Dec. 1, 2008 (JP) ................................. 2008-305932

(51) Int. Cl.
*H03K 3/00* (2006.01)

(52) U.S. Cl. ......................... 327/291; 327/298; 327/172

(58) Field of Classification Search ........................ None
See application file for complete search history.

(56) References Cited

U.S. PATENT DOCUMENTS

| 7,327,179 B2 * | 2/2008 | Sawyer et al. ................ 327/291 |
| 7,528,640 B2 * | 5/2009 | Huang et al. .................. 327/172 |
| 2007/0076832 A1 | 4/2007 | Matsudera |

FOREIGN PATENT DOCUMENTS

| JP | 2006-211208 A | 8/2006 |
| JP | 2007-102483 A | 4/2007 |

* cited by examiner

*Primary Examiner* — An T Luu (74) *Attorney, Agent, or Firm* — Arent Fox LLP (57) ABSTRACT

A clock signal generation apparatus includes a clock signal generation circuit generating a plurality of clock signals, and a self-test circuit measuring a phase difference of one pair of clock signals. The self-test circuit includes a clock signal selection circuit selecting the pair of clock signals among the plurality of clock signals, a phase detection circuit generating a phase difference pulse signal, a test signal generation circuit generating a test signal having a frequency which is lower than the phase difference pulse signal, and a counter circuit counting the pulse number of the test signal.

8 Claims, 8 Drawing Sheets

CLOCK SIGNAL GENERATION CIRCUIT

CROSS-REFERENCE TO RELATED APPLICATIONS

This application is based upon and claims the benefit of priority from the prior Japanese Patent Application No. 2008-305932, filed on Dec. 1, 2008, the entire contents of which is incorporated herein by reference.

FIELD

The present invention relates to a clock signal generation circuit.

BACKGROUND

A clock signal generation circuit which generates a plurality of clock signals having mutually differing phases is used in an orthogonal transformation circuit of a communication instrument, asynchronous dynamic random access memory (SDRAM), and the like. Such a clock signal generation circuit includes, for example, a PLL circuit or a DLL circuit. The generated plurality of clocks are, for example, four clock phases having phase differences of 0°, 90°, 180°, and 270° with a phase of a reference clock, in this case, the four clocks have a phase difference of 90° each in order.

Japanese Laid-open Patent Publication No. 2007-102483 and Japanese Laid-open Patent Publication No. 2006-211208 both disclose a clock generation circuit which generates four-phase clocks. In the clock generation circuits disclosed in these patent documents, a voltage-controlled oscillation circuit (VCO) included in the clock generation circuit generates the four-phase clocks. Also, the voltage-controlled oscillation circuit corrects a variation in phase difference between the four clocks arising due to a characteristic error of the clock generation circuit, or the like, and generates four-phase clocks which have an ideal phase difference.

A circuit is known that generates clocks of an even number of phases, for example, four phases. This known circuit generates a high speed clock having a frequency four times that of clocks to be generated, and divides the frequency of the high speed clock. In a circuit which generates four-phase clocks of 300 MHz to 3 GHz, called a UHF band, it is necessary to generate a high speed clock of a frequency four times that of the UHF band. For this reason, when the clock generation circuit is realized with an LC resonance type of VCO, which has a high power consumption, the circuit becomes one with a large chip area, and expensive.

Unlike the circuit which divides the frequency of a high speed clock with a frequency four times that of the clocks to be generated, a ring oscillator type of VCO, which generates four-phase clocks, may not generate a high speed clock. However, a variation in phase differences between the clocks may arise due to a characteristic error of the circuit, or the like. Consequently, with such a VCO, a shipping test may be performed to determine whether or not the phase differences between the clocks are within an allowable range.

As it is difficult to measure the phase differences of four-phase clocks of, for example, 300 MHz to 3 GHz with a testing device, there is desired a clock generation circuit wherein determining whether or not the variation in the phase differences between the clocks is within an allowable range may performed using a simple method.

SUMMARY

According to an aspect of the disclosure, a clock signal generation apparatus includes a clock signal generation circuit generating a plurality of clock signals, and a self-test circuit measuring a phase difference of one pair of clock signals. The self-test circuit includes a clock signal selection circuit selecting the pair of clock signals among the plurality of clock signals, a phase detection circuit generating a phase difference pulse signal, a test signal generation circuit generating a test signal having a frequency which is lower than the phase difference pulse signal, and a counter circuit counting the pulse number of the test signal.

The object and advantages described herein will be realized and attained by means of the elements and combinations particularly pointed out in the claims. It is to be understood that both the foregoing general description and the following detailed description are exemplary and explanatory and are not restrictive of the invention, as claimed.

DESCRIPTION OF THE EMBODIMENT

Figure 1:
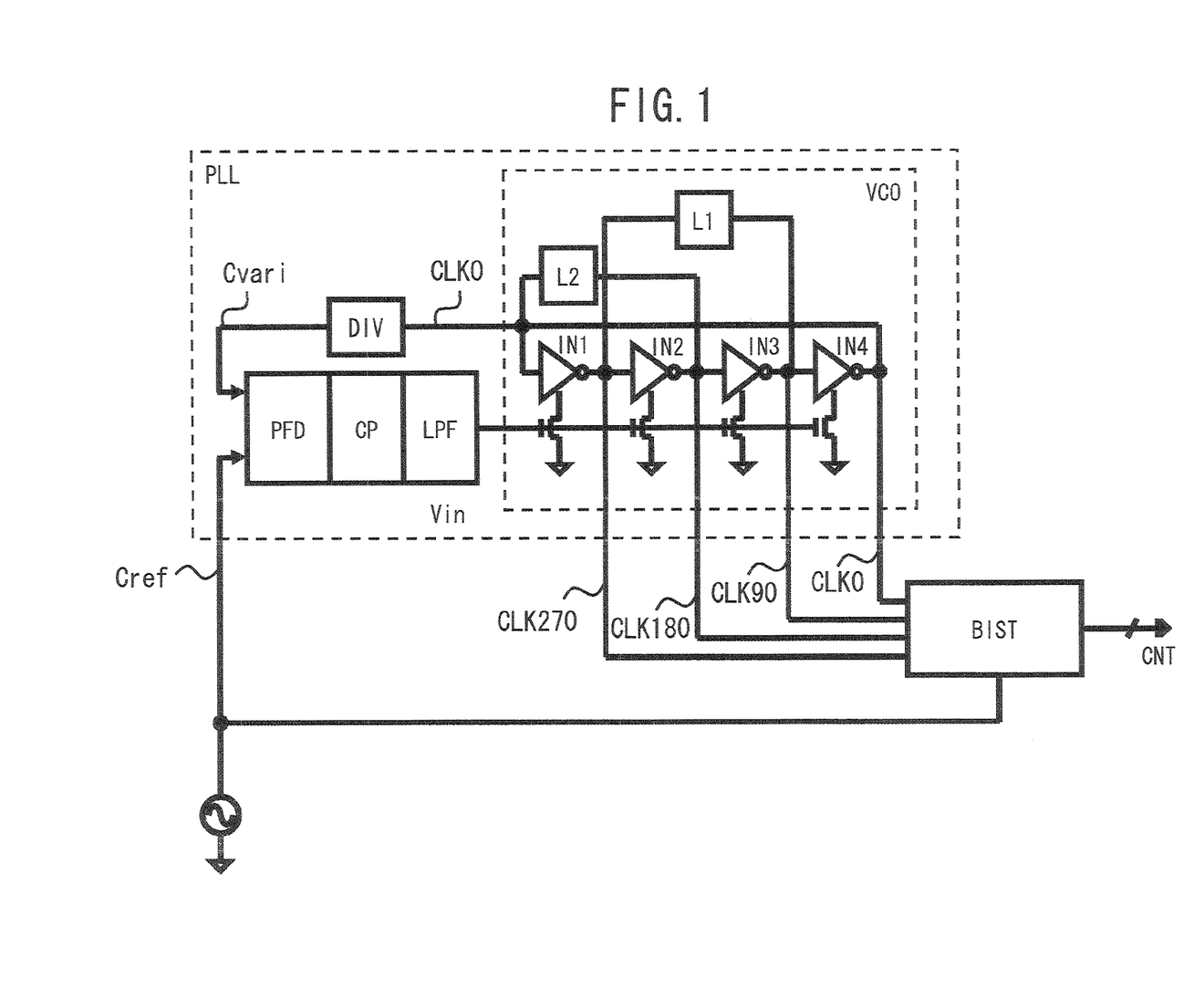
FIG. 1 is a configuration diagram of a clock signal generation circuit.

FIG. 1 is a configuration diagram of a clock signal generation apparatus. The clock signal generation apparatus has a clock signal generation circuit, which has a phase locked loop (PLL) circuit having a voltage-controlled oscillator VCO which generates four-phase clock signals, CLK0, CLK90, CLK180, and CLK270. The clock signal generation apparatus also includes a self-test circuit BIST which measures a phase difference of each pair of clock signals, among the four-phases clock signals, which have adjacent phases. The clock singal generation circuit and self-test circuit are formed on a same chip. As the self-test circuit is formed on the same chip as the clock signal generation circuit, it is called a built-in self-test circuit.

The voltage-controlled oscillator VCO, coupling four sets of inverting delay circuits IN1 to IN4 in a ring form, has a first latch circuit L1 which latches an output node pair of the clock signals CLK90 and CLK270, and a second latch circuit L2, which latches an output node pair of the clock signals CLK0 and CLK180. The amount of delay of the each delay circuit is controlled by a control voltage Vin. If amounts of delay of the delay circuits INV1 to INV4 are set to be substantially equal, the four clock signals CLK0, CLK90, CLK180, and CLK270 become four-phase clock signals which are each different in phase by about 90°. If amounts of delay of the delay circuits INV1 to INV4 are set to a certain ratio, the four clock signals have a phase which is a phase of one cycle, that is, 360 degrees, depending on the ratio set.

Figure 2:
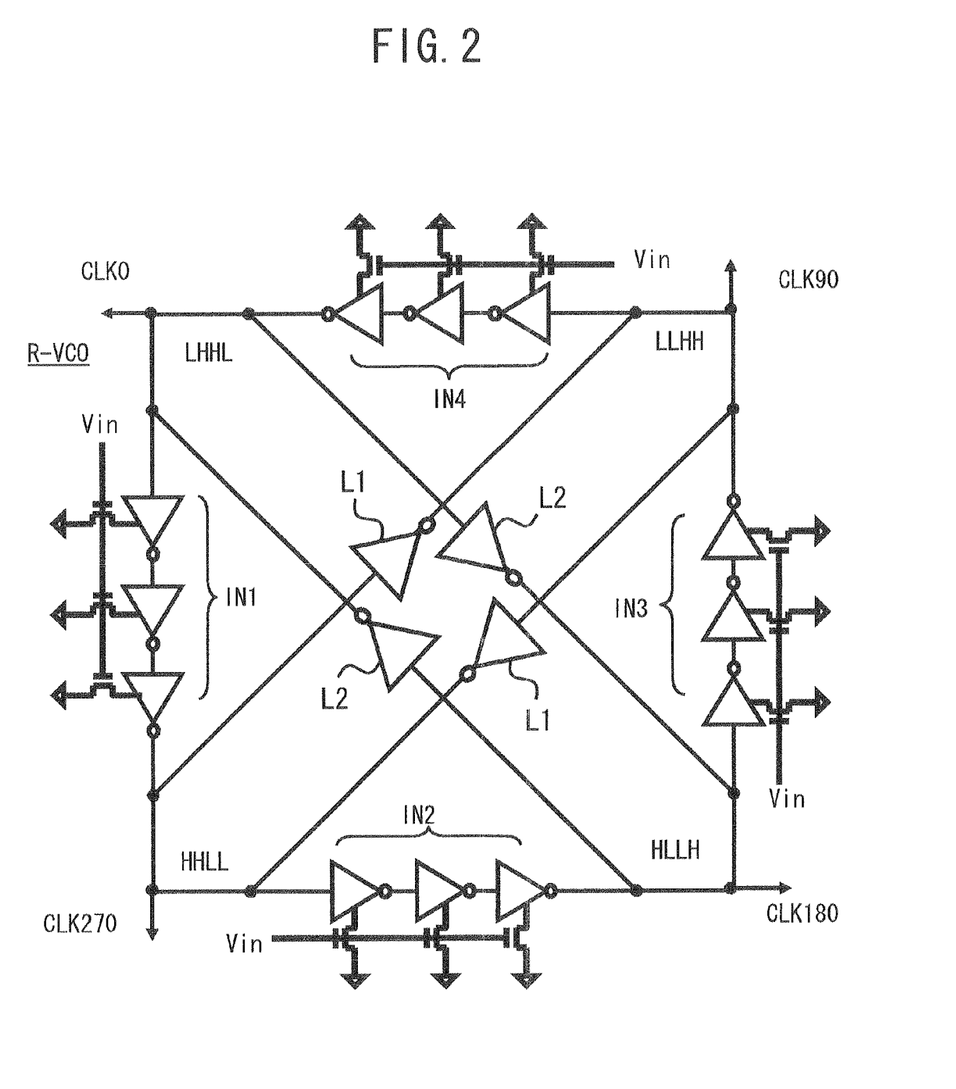
FIG. 2 is a detailed circuit diagram of a voltage-controlled oscillator VCO of FIG. 1.

FIG. 2 is a detailed circuit diagram of the voltage-controlled oscillator VCO of FIG. 1. The voltage-controlled oscillator VCO has the inverting delay circuits INV1 to INV4 between the output nodes of the four clock signals CLK0, CLK90, CLK180, and CLK270. Each of the inverting delay circuits INV1 to INV4, having an odd number of inverters, for example, three inverters, delays an input clock signal, and outputs an inverted clock signal. Also, it has the first latch circuit L1, which latches voltage level of the output node pair of the clock signals CLK90 and CLK270, and the second latch circuit L2, which latches voltage level of the output node pair of the clock signals CLK0 and CLK180. The first and second latch circuits L1 and L2 are configured such that the input and output of one pair of inverters are coupled to each other, the first latch circuit L1 latches the clock signals CLK90 and CLK270 at a level at which they are mutually inverted, and the second latch circuit L2 latches the clock signals CLK0 and CLK180 at a level at which they are mutually inverted.

Figure 3:
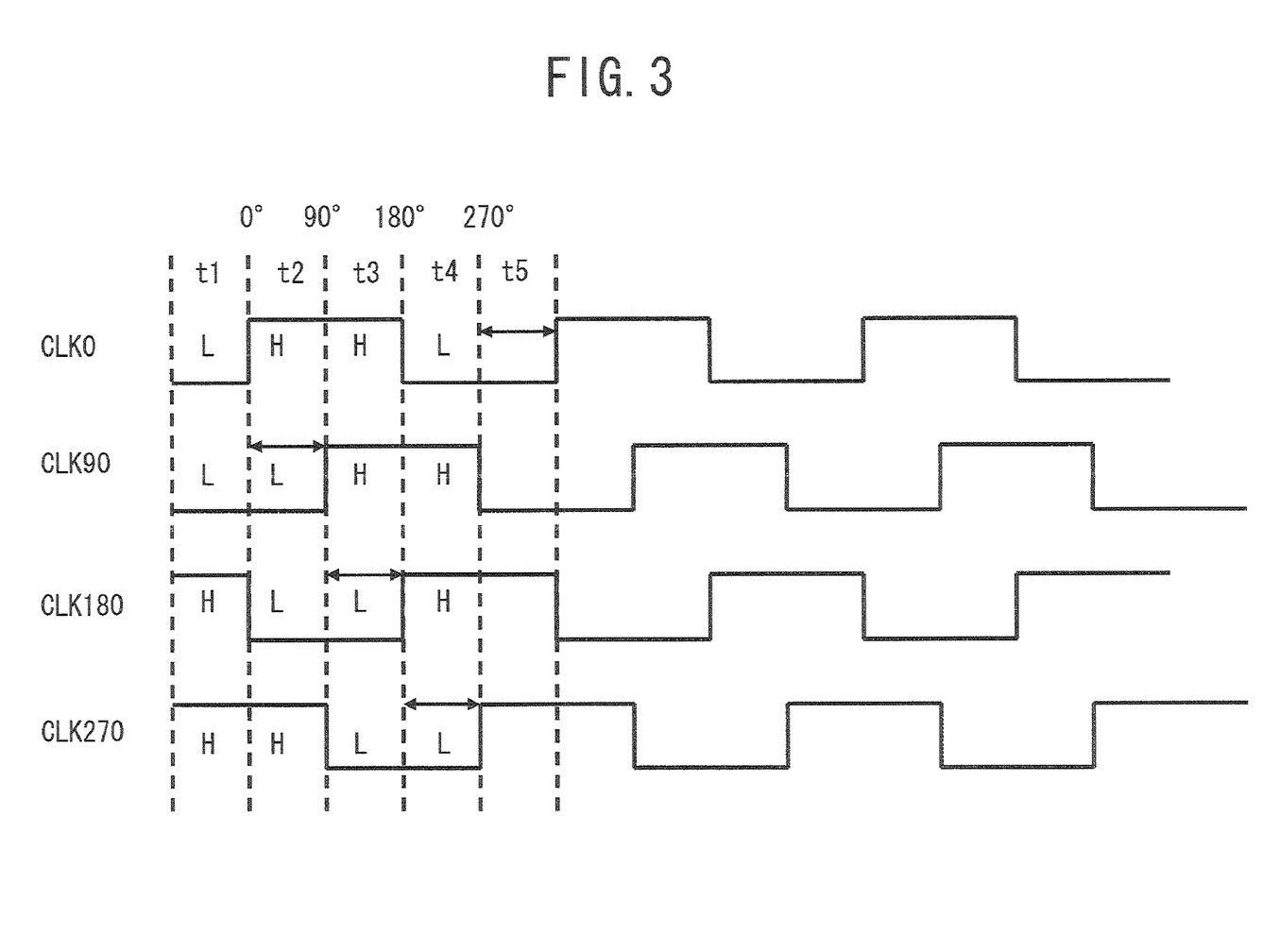
FIG. 3 is a waveform diagram of four-phase clocks of the voltage-controlled oscillator VCO of FIG. 2.

FIG. 3 is a waveform diagram of the four-phase clock signals of the voltage-controlled oscillator VCO of FIG. 2. For example, when the clock signal CLK0 is at an L level at the start of a period t1, the clock signal CLK180 is at an H level due to the latch circuit L2. Then, an L level signal of the clock signal CLK0 propagates through the delay circuit IN1 during the period t1, putting the clock signal CLK270 at the H level at the start (phase 0°) of a period t2. In the same way, an H level signal of the clock signal CLK180 propagates through the delay circuit IN3, putting the clock signal CLK90 at the L level at the start (phase 0°) of the period t2. Furthermore, an H level signal of the clock signal CLK270 propagates through the delay circuit IN2 during the period t2, putting the clock signal CLK180 at the L level at the start (phase 90°) of a period t3, and in the same way, an L level signal of the clock signal CLK90 propagates through the delay circuit IN4, putting the clock signal CLK0 at the H level.

In the same way, the clock signals CLK90 and CLK270 being at mutually inverted levels due to the latch circuit L1, the inverted clock signals propagate through the delay circuits IN INV1 to INV4. As a result, the respective clock signals CLK0, 90, 180, and 270 become the L or H level, as illustrated in FIGS. 2 and 3, and the phase difference between one pair of clock signals with adjacent phases is controlled to be 90°.

In FIG. 1, the PLL circuit has a divider circuit DIV, which divides the frequency of the clock signal CLK0 which is the reference of the voltage-controlled oscillator VCO, a phase detector PFD, which detects a phase difference between an output clock signal Cvari of the divider circuit DIV and a reference clock signal Cref, a charge pump circuit CP, which generates a charge during a period of the phase difference detected by the phase detector PFD, and an integrated circuit LPF, which generates the control voltage Vin corresponding to the charge amount of the charge pump circuit CP. The control voltage Vin is generated with the phase detector PFD, charge pump circuit CP, and integrated circuit LPF. A circuit which has the phase detector PFD, charge pump circuit CP, and integrated circuit LPF is called a control voltage generation circuit. The PLL circuit, as well as generating the high frequency clock signal CLK0 phase locked with the reference clock signal Cref, generates the clock signals CLK90, CLK180, and CLK270, whose phases are progressively delayed by 90° from the clock signal CLK0. The clock signals CLK0 to CLK270 have a frequency which is higher than the frequency of the reference clock signal Cref by N times, which is a division ratio of the divider circuit DIV.

The self-test circuit BIST, at a time of an operational test, measures the phase difference of each pair of clock signals, among the plurality of clock signals CLK0 to CLK270, which have adjacent phases, and outputs the measured count value CNT.

Figure 4:
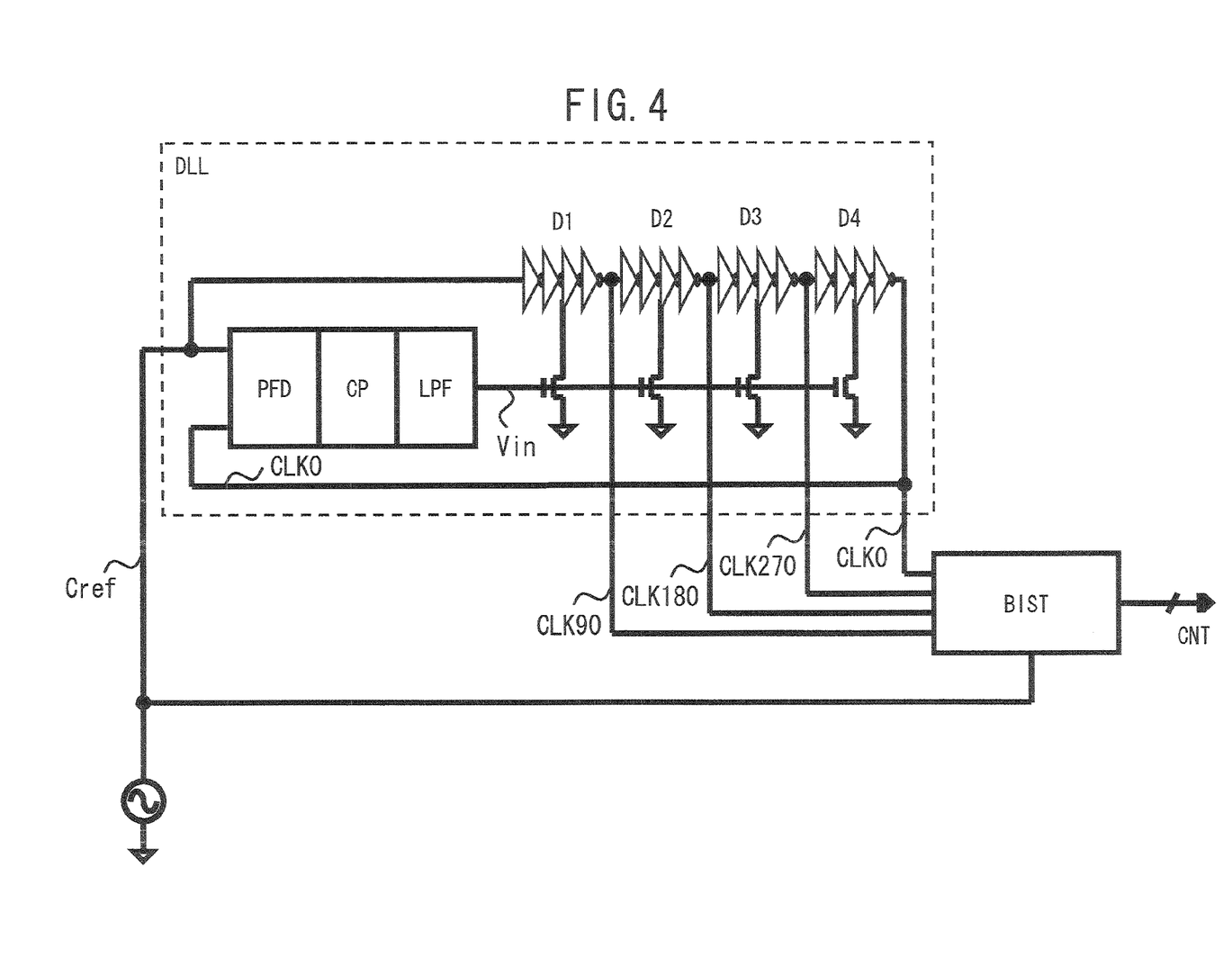
FIG. 4 is a configuration diagram of another clock signal generation circuit.

FIG. 4 is a configuration diagram of another clock signal generation circuit. The clock signal generation circuit has a delay locked loop (DLL) circuit, and a self-test circuit BIST which measures the phase difference of each pair of clock signals which have adjacent phases. The DLL circuit has a clock signal generation circuit which generates a plurality of clock signals CLK0, CLK 90, CLK180, and CLK270.

The DLL circuit has delay circuits D1, D2, D3, and D4, which each delay a reference clock signal Cref and output the four clock signal CLK0, CLK 90, CLK180, and CLK270 respectively. The DLL circuit further comprises a phase detector PFD, which detects a difference between a phase of the clock signal CLK0 output by the circuit D4, the final stage of the delay circuits, and a phase of the reference clock signal Cref; a charge pump circuit CP, which generates a charge during a period of the phase difference detected by the phase detector PFD; and an integrated circuit LPF, which generates a control voltage Vin corresponding to the charge amount of the charge pump circuit CP. The control voltage Vin is generated with the phase detector PFD, charge pump circuit CP, and integrated circuit LPF. A circuit which has the phase detector PFD, charge pump circuit CP, and integrated circuit LPF is called a control voltage generation circuit. The DLL circuit generates the plurality of clock signals CLK0, CLK 90, CLK180, and CLK270 by causing the phase of the reference clock signal Cref to be delayed, and controls the amount of delay of the delay circuits D1 to D4 with the control voltage Vin in such a way as to cause the phases of the clock signal CLK0 and the reference clock signal Cref to match. By making the amounts of delay of the delay circuits D1 to D4 substantially equal, the four-phase clock signals CLK0 to CLK270 may be generated, wherein the phases are delayed by about 0°, 90°, 180°, and 270° respectively from the reference clock signal Cref.

The self-test circuit BIST, in the same way as in FIG. 1, measures the phase difference of each pair of clock signals, among the four-phase clock signals, which have adjacent phases.

The PLL circuit of FIG. 1 is utilized as, for example, a clock synthesizer in a communication circuit. Also, the DLL circuit of FIG. 4 is built into, for example, a high speed SDRAM or a double data rate SDRAM.

Figure 5:
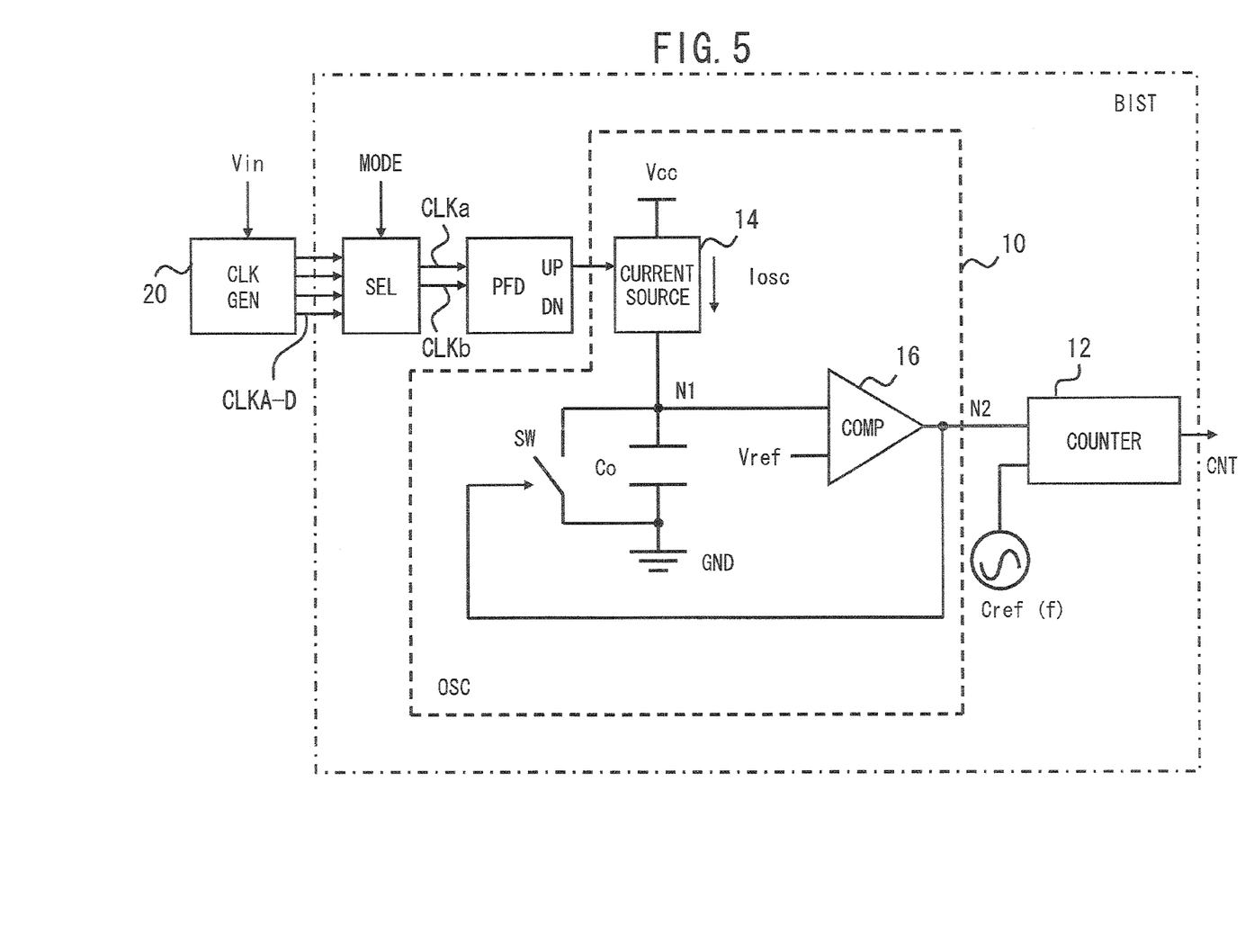
FIG. 5 is a circuit diagram of a self test circuit.

FIG. 5 is a circuit diagram of the self test circuit. The self-test circuit BIST measures the phase difference of each pair of clock signals, among a plurality of clock signals generated by a clock signal generation circuit 20, which have adjacent phases, and outputs the measured count value CNT. The self-test circuit BIST has a clock selection circuit SEL, which selects one pair of clock signals, among the plurality of clock signals CLKA to CLKD generated by the clock signal generation circuit 20, which have adjacent phases, a phase detection circuit PFD, which repeatedly generates a phase difference pulse signal UP having a pulse width corresponding to the phase difference of the selected pair of clock signals CLKa and CLKb, a test signal generation circuit 10, which generates a test signal N2 having a frequency which, being a frequency proportional to the pulse width of the phase difference pulse signal UP, is lower than the phase difference pulse signal UP, and a counter 12, which counts the pulse number of the test signal N2 in a reference period of the reference clock signal Cref, and outputs the relevant count value CNT.

The PLL circuit of FIG. 1, the DLL circuit of FIG. 4, or the like may be used as the clock signal generation circuit 20 to generate the plurality of clock signals CLKA to CLKD, whose phases differ. The plurality of clock signals CLKA to CLKD being, for example, clocks of a desired phase relationship within one cycle, may have the same phase difference or different phase difference. Using the clock signal generation circuit of FIG. 1 or FIG. 4, four-phase clock signals, each of which has a phase difference of about 90° with respect to another, are generated.

The clock signal selection circuit SEL, in response to a selection mode signal MODE, selects one pair of clock signals which have adjacent phases from the plurality of clock signals CLKA to CLKD, and outputs them as the clock signals CLKa and CLKb. In response to the selection mode signal MODE, it is possible to select any one of a combination of the clock signals CLK0 and CLK90, a combination of the clock signals CLK90 and CLK180, a combination of the clock signals CLK180 and CLK270, or a combination of the clock signals CLK270 and CLK0.

Figure 6:
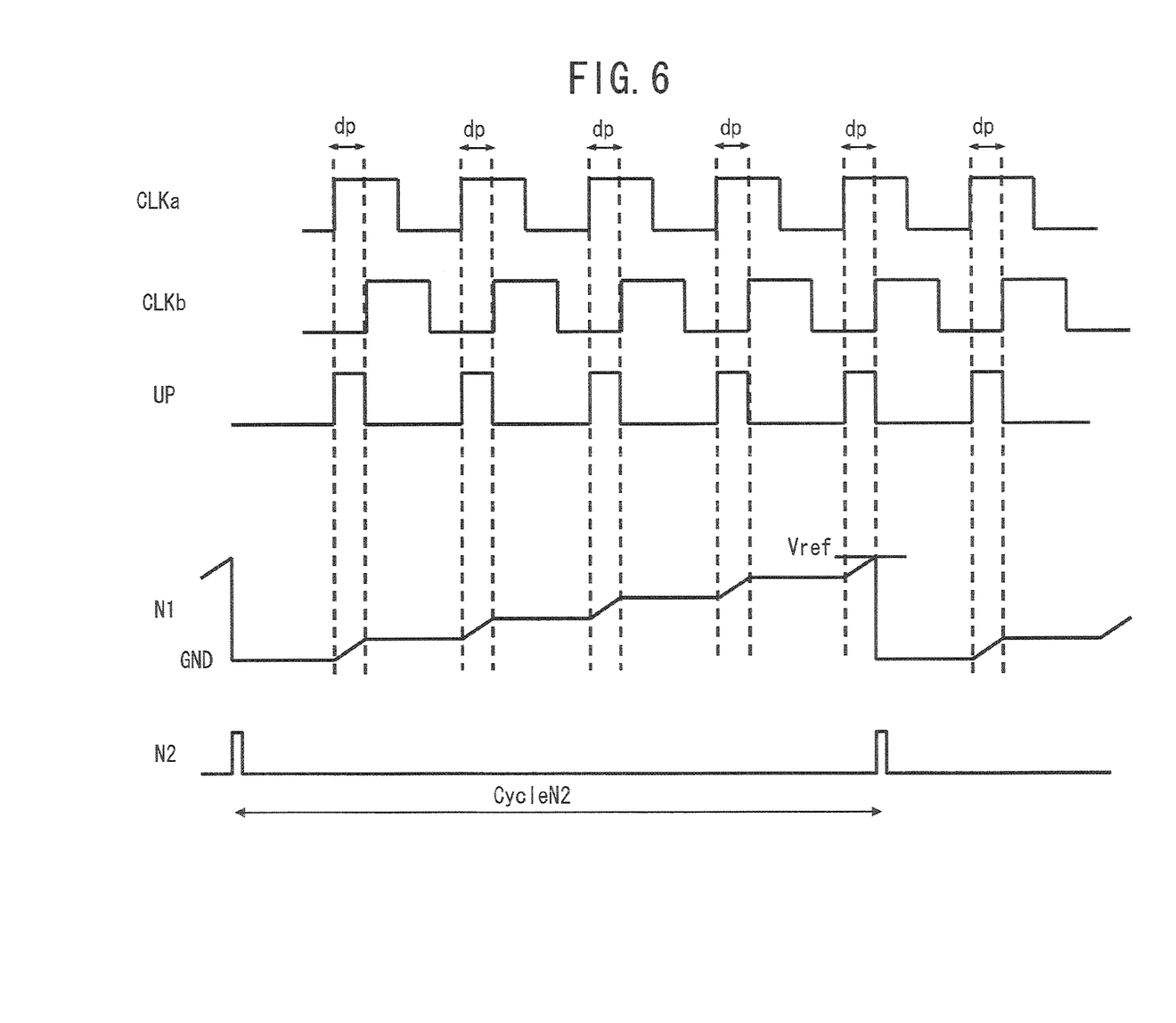
FIG. 6 is an operational waveform diagram of the self-test circuit.

FIG. 6 is an operational waveform diagram of the self-test circuit. The clock signals CLKa and CLKb selected by the clock signal selection circuit SEL, the phase difference pulse signal UP, a node N1 signal, and the test signal N2 are illustrated in FIG. 6.

The phase detection circuit PFD repeatedly generates the phase difference pulse signal UP having a pulse width of the phase difference dP of the pair of clock signals CLKa and CLKb selected by the clock signal selection circuit SEL.

In the test signal generation circuit 10, a current source 14 sends a current Iosc to a capacitor C0 in response to the phase difference pulse signal UP. The capacitor C0 is reset to about zero charge condition by a switch SW, which energizes in response to the test signal N2 output by a comparator 16, and accumulates a charge in accordance with the current Iosc sent by the current source 14 in response to the phase difference pulse signal UP. Due to this charge accumulation, the voltage of the node N1 of an electrode on the side opposite to the ground GND side of the capacitor C0 rises at a gradient corresponding to the current Iosc while the phase difference pulse signal UP is at the H level, as illustrated in FIG. 6. The gradient of the rise is greater as the phase difference dP is great.

The comparator 16 outputs a pulse of the test signal N2 every time the voltage of the node N1 reaches a reference voltage Vref. In response to the pulse of the test signal N2, the switch SW closes, resetting the capacitor C0, and the voltage of the node N1 is reduced to the ground GND. Then, once more, the voltage of the node N1 rises due to the current Iosc, and is reduced to the ground on reaching the reference voltage Vref, with this operation being repeated thereafter.

Due to the operation of the test signal generation circuit 10, the test signal N2 has a frequency which, being a frequency substantially proportional to the pulse width dP of the phase difference pulse signal UP, is lower than the phase difference pulse signal UP. That is, the greater the phase difference between the pair of clock signals CLKa and CLKb, the faster the rise in the voltage of the node N1, the shorter a cycle CycleN2 of the test signal N2, and the higher the frequency of the test signal N2. Conversely, the smaller the phase difference between the pair of clock signals CLKa and CLKb, the slower the rise in the voltage of the node N1, the longer the cycle CycleN2 of the test signal N2, and the lower the frequency of the test signal N2.

On increasing the capacity of the capacitor C0, or on reducing the current Iosc of the current source 14, the frequency of the test signal N2 becomes lower in comparison with the phase difference pulse signal UP. Consequently, the test signal N2, having a low frequency in comparison with the clock signals CLKA to CLKD, has a frequency proportional to the phase difference of the pair of clock signals CLKa and CLKb. Therefore, it is possible to make the test signal N2 of a frequency low enough to be countable by the counter 12.

The capacitor C0 of the test signal generation circuit 10 may be coupled to a power source Vcc side, the current source 14 is coupled to the ground side, and the switch SW causes the capacitor C0 and the coupling node N1 of the current source 14 to short circuit at the power source Vcc.

Furthermore, the switch SW of the test signal generation circuit 10 may be disposed so as to cause the node N1 to short circuit at the power source Vcc, and the charge of the capacitor may be discharged due to the current of the current source 14. In this case, the charge of the capacitor is discharged due to the current from the current source 14, and the signal of the node N1 takes a waveform which drops from the power source Vcc and returns to the level of the power source Vcc on reaching the reference voltage Vref. In this case, an input terminal of the comparator 16 has a polarity opposite to that of FIG. 4.

Figure 7:
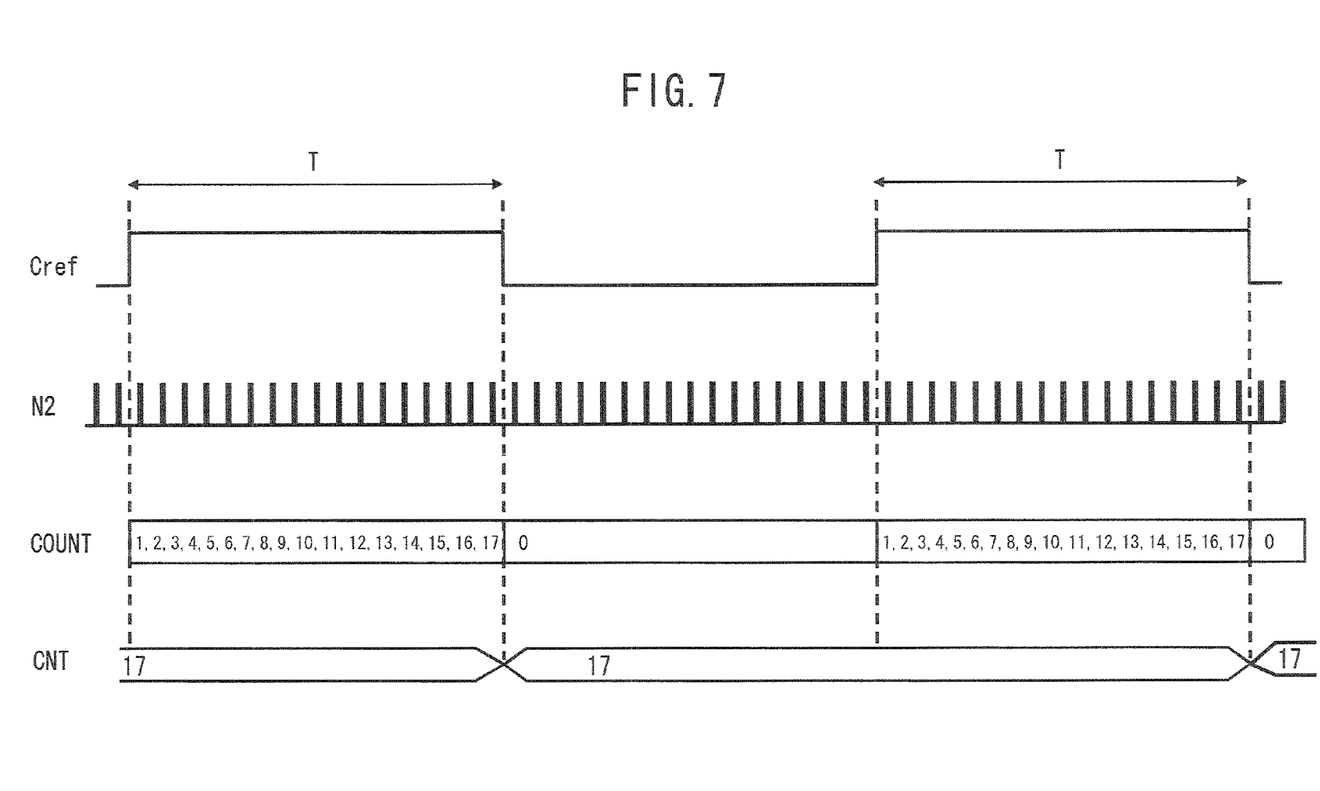
FIG. 7 is a waveform diagram illustrating an operation of a counter 12.

FIG. 7 is a waveform diagram illustrating an operation of the counter 12. The counter 12 counts the pulse number of the test signal N2 in response to a rising edge of the reference clock signal Cref, outputs the count value CNT at a trailing edge of the reference clock signal Cref, and is reset. In the example of the PLL circuit of FIG. 1, the reference clock signal Cref, being a clock signal with a frequency which is obtained by dividing the frequency of the four-phase clock signals to be generated, is a clock signal with a frequency lower than the frequency of the test signal N2. The counter 12 counts the test signals N2 during the reference period while the reference clock Cref is in the H level, and outputs the count value CNT thereof.

A count value COUNT inside the counter 12 increases in response to the test signal N2 during the reference period T while the reference clock signal Cref is in the H level, and the count value is output when the reference clock signal Cref drops to the L level. In the example of FIG. 7, the count values CNT during the reference periods T are "17" respectively.

As the reference clock Cref and test signal N2 are asynchronous, the count value CNT during each reference period T may have a margin of error of +1 or −1. However, by lengthening the cycle of the reference period T, it is possible to reduce the margin of error. Alternatively, it is possible to reduce the margin of error by increasing the number of counts, and taking an average value.

When the clock signal generation circuit 20 is configured of the DLL circuit of FIG. 4, the reference clock signal Cref input into the counter 12 is made a low speed clock wherein the frequency of the reference clock signal Cref inside the DLL circuit of FIG. 4 is divided.

As illustrated in FIG. 5, the self-test circuit BIST, in an operation test, selects one pair of clock signals which have adjacent phases from the plurality of clock signals CLKA to CLKD in response to the selection mode signal MODE, and outputs a count value CNT corresponding to the phase difference of the selected clock signals. By controlling the selection mode signal MODE, the self-test circuit BIST sequentially selects different pairs of clock signals which have adjacent phases from the plurality of clock signals CLKA to CLKD, and outputs the count value CNT of each one. Then, by carrying out the calculation below, the self-test circuit BIST detects the angle of the phase difference between the clock signals CLKa and CLKb.

$$Phase_{A-B} = \frac{Code_A}{Code_A + Code_B + Code_C + Code_D}$$

$$= \frac{17}{17+28+17+28}$$

$$= 0.188$$

Herein, Phase$_{A-B}$ indicates a ratio of the phase difference between the clock signals CLKA (=CLK0) and CLKB (=CLK90) with respect to one cycle) (360°). Also, Code$_A$ indicates the count value CNT when the clock signals CLKA (=CLK0) and CLKB (=CLK90) are selected, Code$_B$ the count value CNT when the clock signals CLKB (=CLK90) and CLKC (=CLK180) are selected, Code$_C$ the count value CNT when the clock signals CLKC (=CLK180) and CLKD (=CLK270) are selected, and Coders the count value CNT when the clock signals CLKD (=CLK270) and CLKA (=CLK0) are selected. The value of Phase$_{A-B}$ (0.188) indicates 68 degrees.

In the example illustrated in the above equation, Code$_A$ and Code$_C$ are "17", while Codes and Code$_D$ are "28". Consequently, the count value of one cycle) (360°) being their total "89", the count value "17" of Code$_A$ is "0.188" out of "1.0", which corresponds to one cycle. When the four-phase clock signals CLKA to CLKD are exactly 90° apart, the Phase$_{A-B}$ is "0.25". Consequently, Phase$_{A-B}$=0.188 in the equation corresponds to approximately 68°. By detecting all the phase differences of the clock signals which have adjacent phases, it is possible to detect the phase of each clock signal.

As heretofore described, according to the self-test circuit BIST, with a plurality of clock signals, each having a different phase, generated during one cycle, the phase difference of one pair of clock signals which have adjacent phases is output as a count value CNT. By counting the phase differences of all the different pairs of clock signals, the ratio of one cycle taken up by the phase difference of one pair of clocks is detected, and as a result it is possible to detect the phase of each clock signal. Then, when the phase exceeds an allowable range, it is possible to remove the clock signal generation circuit as a nonconforming article.

Figure 8:
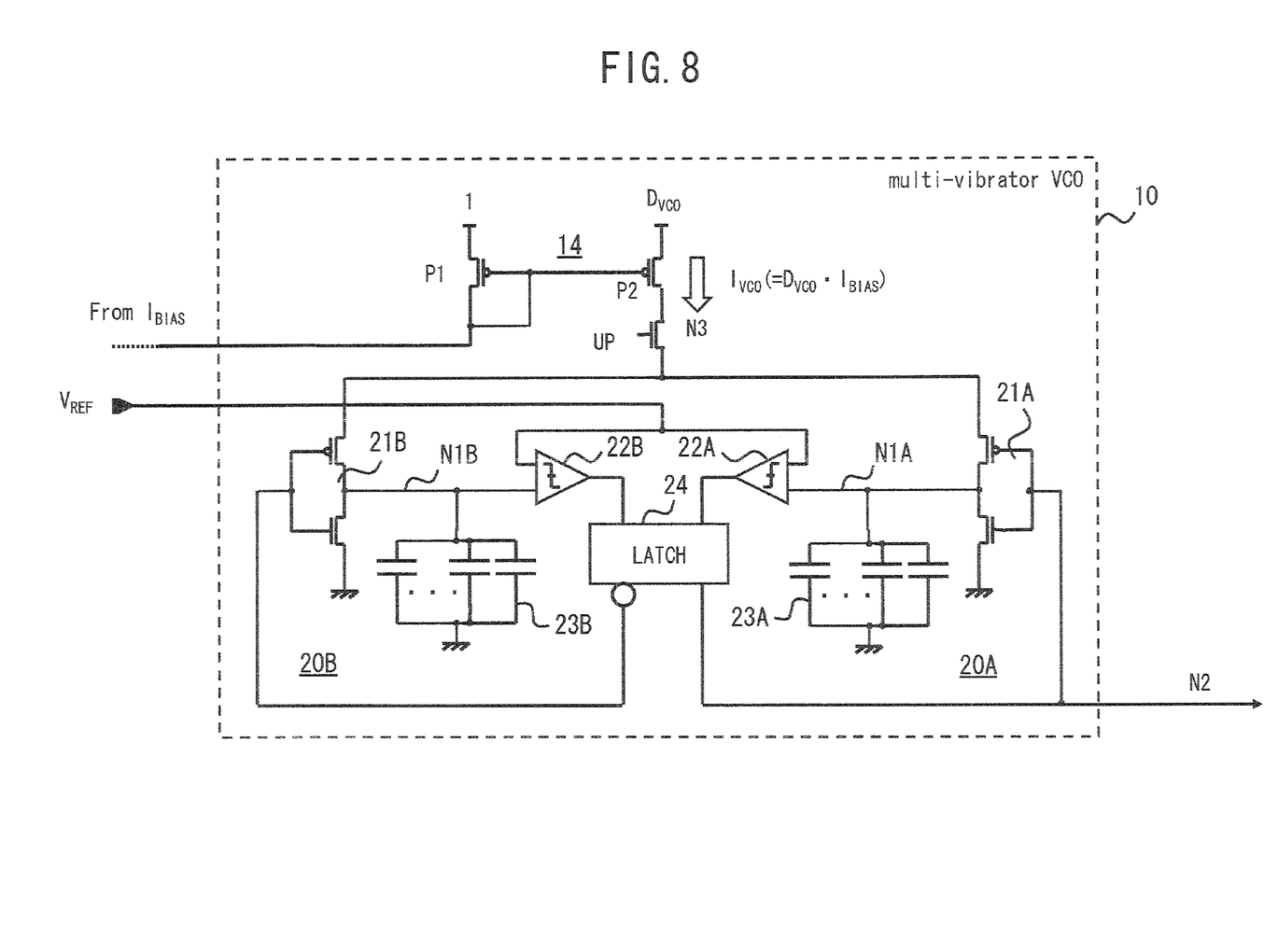
FIG. 8 is a circuit diagram illustrating another example of a test signal generation circuit.

FIG. 8 is a circuit diagram illustrating another example of a test signal generation circuit. This test signal generation circuit 10, in the same way as in FIG. 5, generates a test signal N2 with a frequency which, being a frequency proportional to the pulse width of the phase difference pulse signal UP, is lower than the phase difference pulse signal UP. This test signal generation circuit 10 is called a multi-vibrator VCO. The current source 14 has a P channel transistor P1 and a P channel transistor P2, which configure a current mirror circuit, and an N channel transistor N3, which conducts a current due to the phase difference pulse signal UP. The transistor size ratio of the P channel transistor P1 and P channel transistor P2 is 1:D$_{VCO}$. The current mirror circuit generates a current I$_{VCO}$ in response to a bias current I$_{BIAS}$, and sends the current I$_{VCO}$ in a period in which the phase difference pulse signal UP is at the H level.

The test signal generation circuit 10 has one pair of circuits having the capacitor C0, comparator 16, and switch SW of FIG. 5, one each on the right and left sides. A circuit 20A on the right side has a CMOS inverter 21A, a capacitor 23A, which accumulates a current of a current source, and a comparator 22A, which detects whether the voltage of a node N1A of the capacitor matches a reference voltage V$_{REF}$. In the same way, a circuit 20B on the left side has a CMOS inverter 21B, a capacitor 23B, which accumulates a current of a current source, and a comparator 22B, which detects whether the voltage of a node N1B of the capacitor matches the reference voltage V$_{REF}$. Then, outputs of the comparators 22A and 22B are input into a latch circuit 24.

The left and right circuits 20A and 20B alternately repeat an operation of accumulating the current of the current source. For example, in the circuit 20A on the right side, when the node N2, which is a non-inverted output of the latch circuit 24, is at the L level, the P channel transistor of the inverter 21A gets conductive and supplies the current I$_{VCO}$ to the capacitor 23A. When the node N1A of the capacitor reaches the reference voltage V$_{REF}$, the comparator 22A outputs a pulse, inverting the latch condition of the latch circuit 24. Because of this, the non-inverted output of the latch circuit, the node N2, attains the H level, and the N channel transistor of the inverter 21A gets conductive, resetting the capacitor 23A. While the right circuit 20A is carrying out the heretofore described operation, an inverted output of the latch circuit 24 is at the H level, and the capacitor 23B of the left circuit 20B maintains the reset condition.

When the inverted output of the latch circuit drops to the L level, the left circuit 20B operates in the same way as the right circuit 20A. Then, the left and right circuits 20A and 20B alternately repeat the operation. As a result, the test signal N2 outputs a pulse signal with a duty ratio of 50%. Then, in the same way as in FIG. 5, the frequency of the test signal N2 is proportionate to the pulse width of the phase difference pulse signal UP, that is, to the phase difference of one pair of clock signals.

It is also acceptable to configure the multi-vibrator circuit of FIG. 8 such that the P channel and N channel are reversed, and the ground and power source are reversed.

In the heretofore described embodiment, a description has been given with a four-phase clock signal generation circuit with a phase difference of 90° as an example, but the invention, not being limited to four-phase clock signals, is applicable to a two phase or more clock signal generation circuit with differing phases.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A clock signal generation apparatus comprising:
   a clock signal generation circuit configured to generate a plurality of clock signals, each of the plurality of clock signals having a certain phase difference with respect to a phase of a reference clock; and
   a self-test circuit configured to measure a phase difference of one pair of clock signals, among the plurality of clock signals, which have adjacent phases, wherein
   the self-test circuit comprises:
   a clock selection circuit configured to select the pair of clock signals among the plurality of clock signals;
   a phase detection circuit configured to generate a phase difference pulse signal having a pulse width corresponding to the phase difference of the selected pair of clock signals;
   a test signal generation circuit configured to generate a test signal having a frequency which is proportional to the pulse width of the phase difference pulse signal, and is lower than the phase difference pulse signal; and a counter circuit configured to count the pulse number of the test signal generated within a reference period.

2. The clock signal generation apparatus according to claim 1, wherein the test signal generation circuit comprises:

a current source circuit configured to generate a first current for a period of the pulse width of the phase difference pulse signal;

a capacitor configured to accumulate or discharge electron charge corresponding to the first current;

a comparator configured to generate a pulse of the test signal when the voltage of the capacitor reaches a reference voltage; and a switch configured to discharge or charge the capacitor in response to the pulse of the test signal.

3. The clock signal generation apparatus according to claim 1, wherein the clock signal generation circuit comprises:

a ring oscillator including a plurality of delay circuits, and outputting clock signals respectively.

4. The clock signal generation apparatus according to claim 3, wherein the clock signal generation circuit further comprises:

a divider circuit configured to divide a reference phase clock among the plurality of clock signals; and a control voltage generation circuit configured to detect a phase difference between a reference clock signal and an output clock signal of the divider, and generate a control voltage in accordance with the detected phase difference, wherein the ring oscillator generates the plurality of clock signals with a frequency corresponding to the control voltage.

5. The clock signal generation apparatus according to claim 1, wherein the clock signal generation circuit comprises:

a plurality of delay circuits coupled in series, the plurality of delay circuits configured to generate a plurality of clock signal delay from a reference clock; and a control signal generation circuit configured to detect a phase difference between a phase of the clock signal output by a final stage of the delay circuits and a phase of the reference clock signal, and generate a control signal in accordance with the detected phase difference, wherein the plurality of delay circuits change an amount of delay in response to the control signal.

6. The clock signal generation apparatus according to claim 1, wherein the reference period is a period of one cycle of the reference clock signal.

7. The clock signal generation apparatus according to claim 1, wherein the clock signal selection circuit, in response to a mode signal, sequentially selects all different pairs of clock signals which have adjacent phases among the plurality of clock signals, and the counter outputs the individual count values of all the pairs.

8. A clock signal generation apparatus comprising:

a clock signal generation circuit configured to generate a first clock signal having a first phase, and a second clock signal having a second phase different from the first phase;

a phase detection circuit configured to generate a phase difference pulse signal having a pulse width corresponding to a phase difference between the first phase and the second phase;

a test signal generation circuit configured to generate a test signal having a first frequency, being a frequency proportional to the pulse width of the phase difference pulse signal, lower than a second frequency of the phase difference pulse signal; and a counter circuit configured to count pulse number of the test signal generated within a reference period.

* * * * *